United States Patent
Reaves (10) Patent No.: US 6,987,405 B1
(45) Date of Patent: Jan. 17, 2006

(54) APPARATUS AND METHOD FOR GENERATING MULTI-PHASE SIGNALS WITH DIGITALLY CONTROLLED TRIM CAPACITORS

(75) Inventor: Jimmy Lee Reaves, San Jose, CA (US)

(73) Assignee: MIPS Technologies, Inc., Mountain View, CA (US)

( * ) Notice: Subject to any disclaimer, the term of this patent is extended or adjusted under 35 U.S.C. 154(b) by 20 days.

(21) Appl. No.: 10/274,424

(22) Filed: Oct. 18, 2002

(51) Int. Cl.
  *H03L 7/06* (2006.01)
(52) U.S. Cl. ..................... 327/149; 327/150
(58) Field of Classification Search ............... 327/149, 327/150, 153, 158, 159, 161, 162
See application file for complete search history.

(56) References Cited

U.S. PATENT DOCUMENTS

| | | | |
|---|---|---|---|
| 5,101,117 A | 3/1992 | Johnson et al. ............ 327/149 |
| 5,946,268 A * | 8/1999 | Iwamoto et al. ............ 365/233 |
| 6,549,047 B2 * | 4/2003 | Yamazaki et al. .......... 327/158 |
| 6,573,776 B2 * | 6/2003 | Miyamoto ................... 327/276 |
| 2002/0015338 A1 * | 2/2002 | Lee ............................ 365/200 |

* cited by examiner

*Primary Examiner*—Linh My Nguyen
(74) *Attorney, Agent, or Firm*—Cooley Godward LLP (57) ABSTRACT

An apparatus for generating multi-phase signals includes a delay chain to produce multi-phase signals, a slow boundary signal, and a fast boundary signal. An array of trim capacitors is connected to the delay chain. A timing control window circuit produces a control signal when a reference signal is outside a timing control window defined by the slow boundary signal and the fast boundary signal. A digital circuit produces a digital capacitive trim signal for application to the array of trim capacitors in response to the control signal. The digital capacitive trim signal alters the capacitive loading of the delay chain.

11 Claims, 6 Drawing Sheets

APPARATUS AND METHOD FOR GENERATING MULTI-PHASE SIGNALS WITH DIGITALLY CONTROLLED TRIM CAPACITORS

BRIEF DESCRIPTION OF THE INVENTION

This invention relates generally to delay-locked loops and related techniques for forming multi-phase signals. More particularly, the invention relates to a technique for generating multi-phase signals through the digital control of trim capacitors.

BACKGROUND OF THE INVENTION

Modern high-performance digital chips, such as microprocessors, often employ a single-phase clock for sequencing of internal events. Such clocks provide for two timing edges per cycle: the clock rising edge and the clock falling edge. Large on-chip memories, such as caches, often need more sequence control-timing edges than are provided by a single-phase system clock.

Prior art efforts to generate more timing edges than the system clock provides revolve around circuit and device-characteristic dependent delay chains, so-called "self-timed" circuits. These delay chains typically comprise a set of serially connected inverters, with individual tap lines connected between the inverters. The delay caused by each inverter produces a phase-delayed signal on the tap line attached to the output of the inverter.

Delay chains of this type sometimes use capacitive loading to control the generation of the multi-phase signals. In particular, parallel-connected capacitors are tied to the output of an inverter in the delay chain. There are known prior art techniques to control this capacitive loading using analog voltages. Thus, for example, a continuously variable voltage can be used to control current into a fixed capacitance. Alternately, a continuously variable voltage can be used to control a variable capacitance. Unfortunately, these approaches are expensive to implement for two reasons. First, they require a very quiet voltage source. Second, they require large area filter capacitors.

It is also known to control the loading associated with a fixed capacitance through the use of digitally switched current. There are several problems with this approach. First, it is difficult to produce a linear response in a MOS semiconductor application. In addition, this approach has limited resolution in MOS semiconductor applications.

It is also known to vary the number of identical delay stages (e.g., inverters) through digital control. Switching delay stages in and out of the delay chain provides only course timing control and therefore is not practical in many applications.

A characteristic of self-timed circuits of this type is that they are independent of the system clock. At times this can be a disadvantage, particularly when the sequence control timing edge provided by the self-timed circuit is incorrectly positioned.

In view of the foregoing, it would be desirable to provide a technique for generating multi-phase signals that operates responsive to the system clock. It would be desirable to provide a digital design utilizing a digital control circuit and digital control signals. Such a design should be relatively inexpensive, unlike analog control implementations. A design of this type should also provide a linear response and high resolution.

SUMMARY OF THE INVENTION

The invention includes an apparatus for generating multi-phase signals. The apparatus includes a delay chain to produce multi-phase signals, a slow boundary signal, and a fast boundary signal. An array of trim capacitors is connected to the delay chain. A timing control window circuit produces a control signal when a reference signal is outside a timing control window defined by the slow boundary signal and the fast boundary signal. A digital circuit produces a digital capacitive trim signal for application to the array of trim capacitors in response to the control signal. The digital capacitive trim signal alters the capacitive loading of the delay chain.

The invention also includes a delay chain to produce multi-phase signals. An array of trim capacitors is connected to the delay chain. A first phase detector produces a slow state control signal when a reference signal transitions after a slow boundary signal. A second phase detector produces a fast state control signal when the reference signal transitions before a fast boundary signal. A digital circuit is responsive to the slow state control signal and the fast state control signal to produce a digital capacitive trim signal for application to the array of trim capacitors.

The invention also includes a method of applying a signal to a delay chain to produce multi-phase signals. A digital control signal is generated to increase capacitance in a trim capacitor array connected to the delay chain when a reference signal transitions after a slow boundary signal. A digital control signal is produced to decrease capacitance in the trim capacitor array connected to the delay chain when the reference signal transitions before a fast boundary signal.

The invention further includes applying a signal to a delay chain to produce multi-phase signals. The delay associated with the delay chain is controlled with a trim capacitor array including rows of trim capacitors. Each row is connected to the delay chain and provides a capacitive loading to the delay chain. By applying digital control signals to individual rows of the trim capacitor, the capacitive loading of the delay chain is altered.

The invention may be implemented as a computer data signal embodied in a transmission medium. In this embodiment, computer-readable program code causes a computer to characterize: a delay chain; an array of trim capacitors attached to the delay chain; a timing control window circuit to produce a control signal when a reference signal is outside a timing window; and a digital circuit to produce a digital capacitive trim signal, responsive to the control signal, for application to the array of trim capacitors.

The invention may also be implemented as a computer readable medium to direct the operation of a computer. In this embodiment, computer-readable program code causes a computer to characterize: a delay chain; an array of trim capacitors attached to the delay chain; a timing control window circuit to produce a control signal when a reference signal is outside a timing window; and a digital circuit to produce a digital capacitive trim signal, responsive to the control signal, for application to the array of trim capacitors.

Thus, the invention provides a digital control circuit to generate digital signals that control trim capacitors associated with a delay chain. The digital design is fast, inexpensive, and provides a linear response. The design is insensitive to noise and is otherwise robust. Advantageously, the system clock is used to track the accuracy of the multi-phase signals generated by the design; therefore, the design minimizes signal drift.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
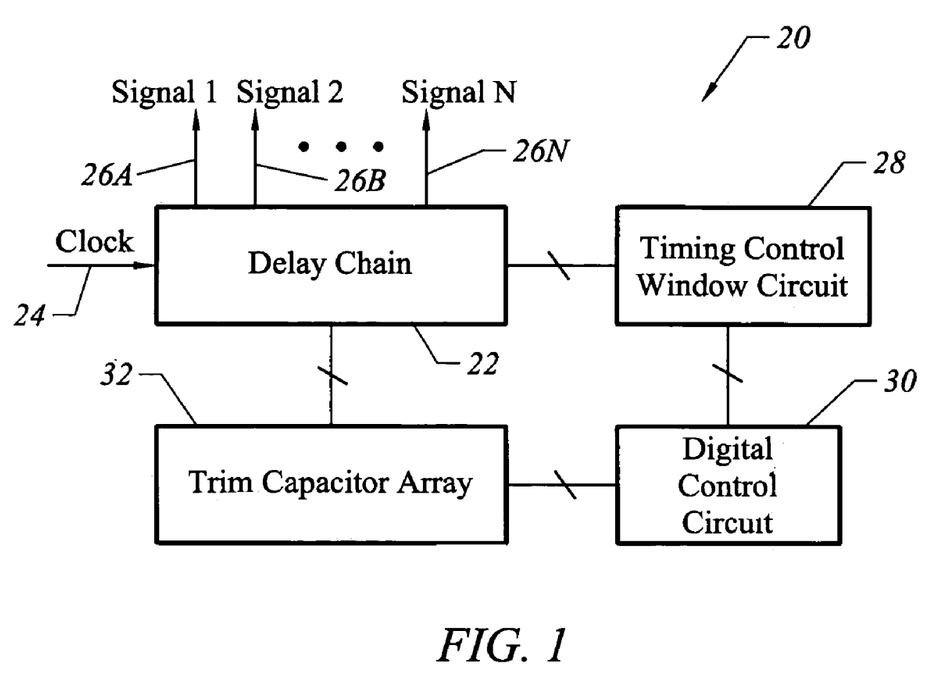
FIG. 1 illustrates an apparatus for generating multi-phase signals through digitally controlled trim capacitors.

FIG. 1 illustrates an apparatus 20 for generating multi-phase signals through the digital control of trim capacitors. The apparatus 20 includes a delay chain 22, which receives a clock signal on an input node 24. The delay chain produces multi-phase signals on tap lines 26A–26N. The output of the delay chain includes a slow boundary signal and a fast boundary signal, which are applied to a timing control window circuit 28. The timing control window circuit 28 compares a reference signal to a timing window framed by the slow boundary signal and the fast boundary signal. If the reference signal is outside this timing window, then a control signal is applied to a digital control circuit 30. The digital control circuit 30 produces a digital capacitive trim signal, which is applied to a trim capacitor array 32. The digital capacitive trim signal controls the capacitive loading on the delay chain, and thereby controls the multi-phase signals produced by the delay chain 22.

Thus, the delay chain 22 is controlled by the trim capacitor array, which is in turn controlled by digital signals from the digital control circuit 30. Unlike analog techniques for controlling capacitive loading, the present invention has a purely digital design. The purely digital design is relatively fast, relatively inexpensive to implement, and provides a linear response. The digital design provides a high level of noise insensitivity and robustness. Thus, the multi-phase signal generator can be utilized in a large number of design spaces. In an embodiment of the invention, the multi-phase signals are generated and controlled from the system clock. Thus, the invention provides the advantages of a self-timed circuit, while still being responsive to the system clock.

The apparatus of the invention can be utilized in connection with on-chip caches of embedded systems. The control technique of the invention allows a single multi-phase signal generator to be ported to various high-frequency and high-performance architectures.

Figure 2:
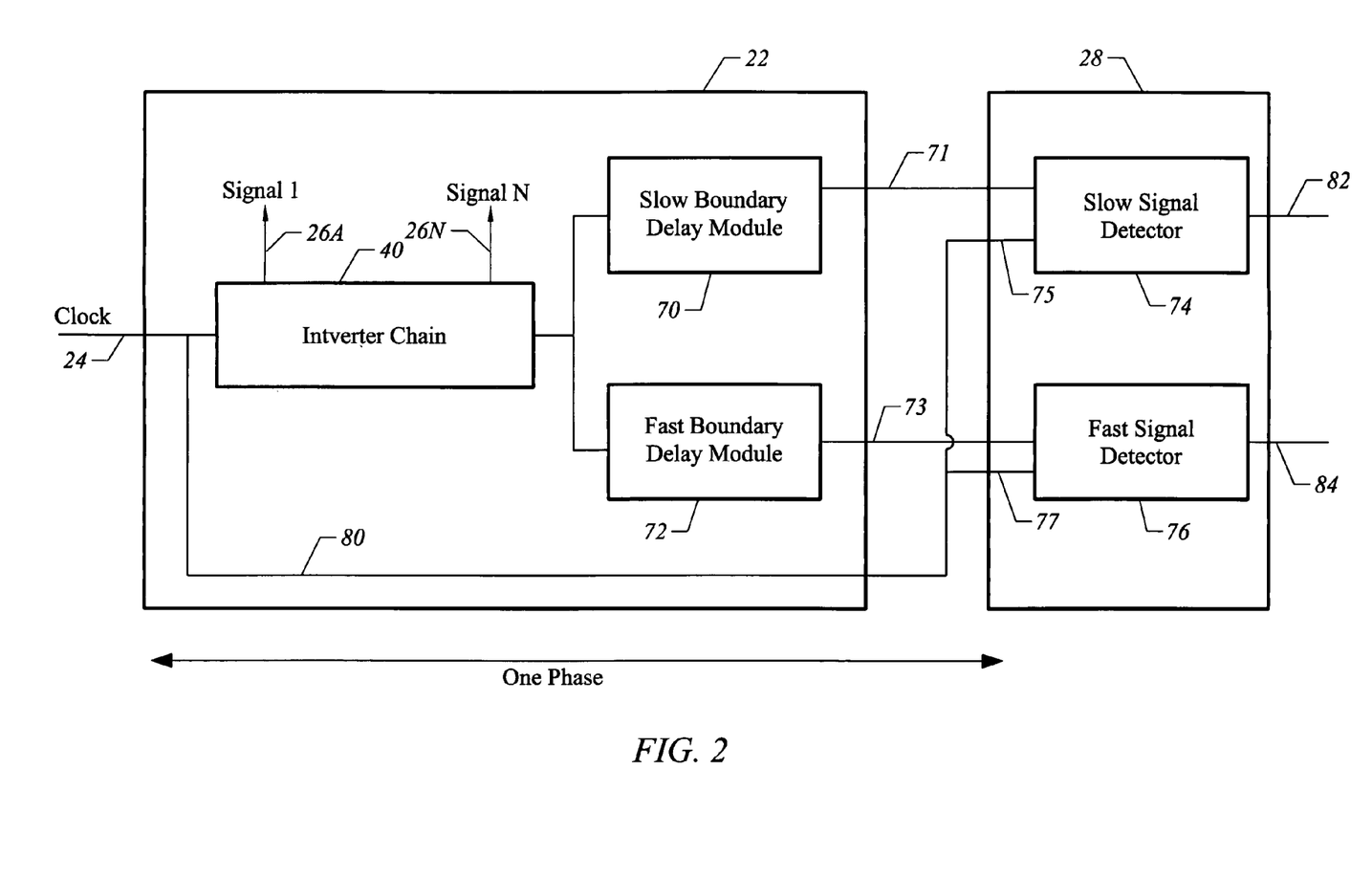
FIG. 2 illustrates a delay chain and timing control window circuit configured in accordance with an embodiment of the invention.
Figure 3:
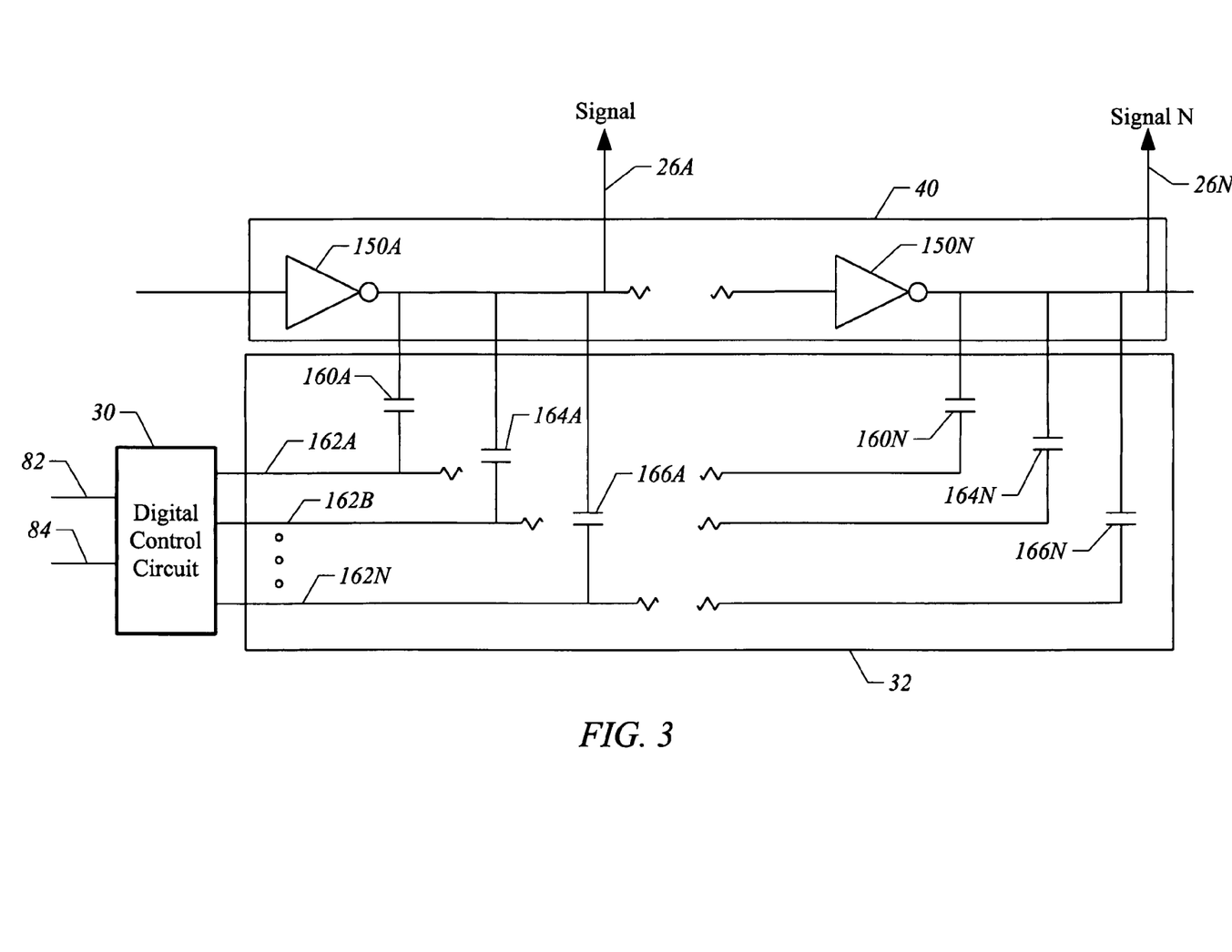
FIG. 3 illustrates an embodiment of an inverter chain of a delay chain of the invention.

FIG. 2 illustrates an embodiment of the delay chain 22 and the timing control window circuit 28. In this embodiment of the invention, the delay chain 22 includes an inverter chain 40 comprising serially connected inverters and individual tap lines connected between the inverters, as shown in FIG. 3, which is discussed below. The inverter chain 40 produces a set of multi-phase signals on tap lines 26A–26N.

The output of the inverter chain has a first branch connected to a slow boundary delay module 70 and a second branch connected to a fast boundary delay module 72. The slow boundary delay module produces a slow boundary signal on node 71. The operation of the slow boundary signal is discussed below in connection with the timing control window circuit 28.

The slow boundary delay module 70 may be implemented through the use of relatively large capacitive loading. For example, if each inverter of the delay chain has a capacitive loading of 20 capacitors, the slow boundary delay module can include a capacitive loading of 30 capacitors. This additional capacitive loading may be formed at the last inverter of the delay chain, instead of being formed as a discrete delay module, as shown in FIG. 2. Observe that the slow boundary delay module 70 may be implemented at the last stage of a single delay chain. Prior art delay chains typically have two or three discrete delay chains.

The fast boundary delay module 72 produces a fast boundary signal on node 73. The utilization of the fast boundary signal is discussed below. The fast boundary delay module 72 may be implemented through the use of relatively small capacitive loading. For example, if each inverter of the delay chain has a capacitive loading of 20 capacitors, the fast boundary delay module can include a capacitive loading of 10 capacitors. Again, this capacitive loading may be formed at the last inverter of the delay chain, instead of being formed as a discrete delay module. Once again, a single delay chain is used, unlike the multiple, discrete delay chains utilized in accordance with the prior art.

FIG. 2 illustrates that the timing control window circuit 28 may be implemented with a slow signal detector 74 and a fast signal detector 76. The slow signal detector 74 receives the slow boundary signal on node 71 and a reference clock signal on node 75. The fast signal detector 76 receives the fast boundary signal on node 73 and a reference clock signal on node 77.

As shown in FIG. 2, a clock signal is applied to node 24. This results in the clock being applied to the inverter chain 40 and to a bypass line 80. The bypass line 80 is configured to have an interval that must be matched by the signals processed by the delay chain signals that pass through the inverter chain 40 and the delay modules 70, 72. In one implementation, the measured interval is one signal phase (i.e., one-half signal cycle), although other arbitrary, but fixed, time intervals may also be used.

The timing control window circuit 28 operates to identify when the signal from the inverter chain 40 drifts from the reference signal from the bypass line 80. If the reference signal transitions after the slow boundary signal, a slow state control signal is applied to node 82. The slow state control signal is processed by the digital control circuit 30, which produces a digital capacitive trim signal that is applied to the trim capacitor array 32. In this case, the digital capacitive trim signal results in additional capacitive loading of the trim capacitor array 32.

If the reference signal transitions before the fast boundary signal, a fast state control signal is applied to node 84. The fast state control signal is processed by the digital control circuit 30, which produces a digital capacitive trim signal that is applied to the trim capacitor array 32. In this case, the digital capacitive trim signal results in the removal of capacitive loading of the trim capacitor array 32.

Thus, the slow boundary signal and the fast boundary signal are used to frame the reference signal. If the reference signal transitions after the fast boundary signal and before the slow boundary signal, no control signal is generated. In this case, the reference signal is appropriately framed by the slow boundary signal and the fast boundary signal. If this framing does not occur, then the capacitive loading of the trim capacitor array 32 is altered to reinstate the framed relationship.

FIG. 3 illustrates that the digital control circuit 30 receives on node 82 a control signal from the slow signal detector 74, while node 84 receives a control signal from the fast signal detector 76. The digital control circuit 30 applies digital signals to the trim capacitor array 32. As shown in FIG. 3, the trim capacitor array 32 includes rows 162A–162N of trim capacitors. Each row has a single capacitor associated with each inverter of the inverter chain 40. For example, row 162A includes a trim capacitor 160A associated with the first inverter 150A of the inverter chain 40 and a trim capacitor 160N associated with the last inverter 150N of the inverter chain 40. Therefore, applying a digital control signal to row 162A will alter the capacitance of capacitors 160A–160N, which are respectively associated with inverters 150A–150N.

Similarly, applying a digital control signal to row 162B will alter the capacitance of capacitors 164A–164N, which are respectively associated with inverters 150A–150N. Finally, applying a digital control signal to the last row 162N will alter the capacitance of capacitors 166A–166N, which are respectively associated with inverters 150A–150N. Therefore, it can be appreciated that applying a digital control signal to a single row uniformly alters the capacitive loading across the inverter chain 40.

Each capacitor may be implemented using a transistor. For example, the gate of the transistor may be tied to the inverter chain 40, while the drain and source of the transistor are tied to a row line 162. Thus, the transistor is operated as a two terminal device. If N-type transistors are used in this configuration, writing a digital one to a row will lower the capacitance, while writing a digital zero to a row will increase the capacitance. This transistor-based implementation of the "capacitors" utilized in accordance with the invention demonstrates that the invention should not be construed as being limited to parallel plate capacitors or any other specific capacitor configuration. Accordingly, a reference to a capacitor or capacitive device should be broadly construed to cover any component with controllable capacitance.

The digital control circuit can be implemented as a shift register. Consider, for example, a 3-bit shift register configured to implement states 000, 001, 011, and 111. Assuming that a single bit controls a single row and N-type transistors are used to implement capacitive loading, the first state (000) results in an increase in capacitance on each row. The second state (001) results in an increase in capacitance on the two rows that receive a digital zero and a decrease in capacitance on the row that receives a digital one. The third state (011) results in an increase in capacitance on the one row that receives a digital zero and a decrease in capacitance on the two rows that receive a digital one. The fourth state (111) results in a decrease in capacitance on each row. Transitions between states occur every time a control signal is received from the timing control window circuit 28. Thus, a slow state control signal will cause an additional bit to turn to zero, while a fast state control signal will cause an additional bit to turn to one.

Various binary weighting schemes may be used in accordance with the invention. In addition, alternate digital control techniques may be used to implement the digital control circuit 30.

Figure 4:
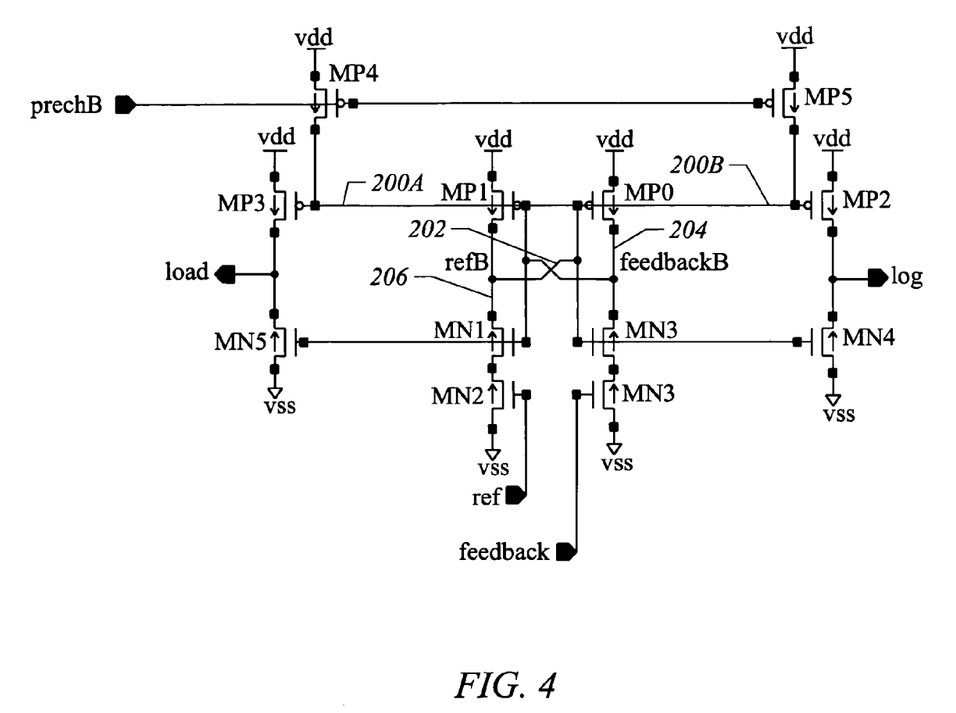
FIG. 4 illustrates a phase detector that may be used to implement the timing control window circuit of the invention.
Figure 5:
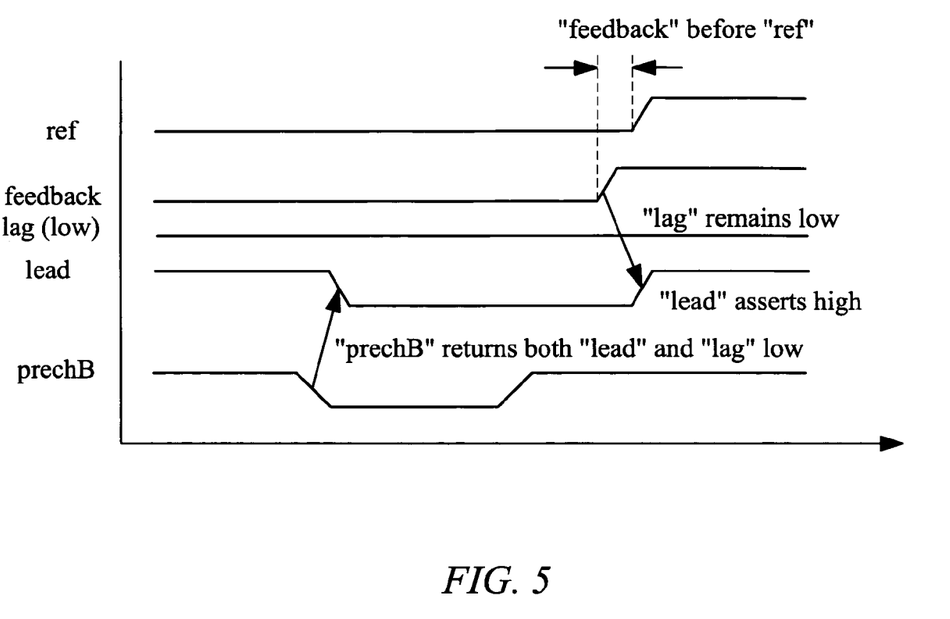
FIG. 5 illustrates timing signals associated with the phase detector of FIG. 4.

FIG. 4 illustrates a phase detector that may be used to implement the slow signal detector 74 and/or the fast signal detector 76. FIG. 5 illustrates timing signals associated with the phase detector of FIG. 4.

When the pre-charge signal (prechB) goes low, P-type transistors MP4 and MP5 turn on. This causes a charging of nodes 200A and 200B, which causes transistors MP0–MP3 to turn off, while the cross-coupled connection 202 remains charged. The cross-coupled connection 202 remains charged during this period because the "ref" and "feedback" signals respectively applied to the gates of transistors MN2 and MN3 are held low, keeping these transistors off.

If the signal from the delay chain, or feedback signal, arrives before the reference signal, then transistor MN3 turns on, which causes the feedbackB node 204 to go low. The cross-coupled connection 202 therefore causes the gate of transistor MN1 to receive a low signal, thereby shutting it off. This shut off state of transistor MN1 isolates transistor MN2 in the event that the reference signal is received after the feedback signal. The low signal on the cross-coupled connection 202 turns on transistor MP3, causing a digital high control signal on the lead output node. The low signal on the cross-coupled connection 202 also causes MP1 to turn on, resulting in the "refb" node 206 going high, which shuts off transistors MP0 and MP2, thereby isolating the "lag" output node.

FIG. 5 illustrates that after the pre-charging operation (prechB), the feedback signal is received, which causes the lead signal to go high. The reference signal is then received, but the lag signal remains low because of the isolation provided by transistor MN1. If the reference signal is received first, the circuit of FIG. 4 operates in a manner symmetrical to the previously described event where the feedback signal is received first.

In addition to implementations of the invention using hardware, the invention can be embodied in a computer usable (e.g., readable) medium configured to store a computer readable code (e.g., computer readable program code, data, etc.). The computer code causes the enablement of the functions or fabrication or both of the invention disclosed herein. For example, this can be accomplished through the use of general programming languages (e.g., C, C++, JAVA, and the like); GDSII databases; hardware description languages (HDL) including Verilog HDL, VHDL, Altera HDL (AHDL) and so on; or other programming and/or circuit (i.e., schematic) capture tools available in the art.

The computer code can be disposed in any known computer usable (e.g., readable) medium including semiconductor memory, magnetic disk, optical disk, (e.g., CD-ROM, DVD-ROM, and the like) and as a computer data signal embodied in a computer usable (e.g., readable) transmission medium (e.g., carrier wave or any other medium including digital, optical or analog-based medium). As such, the computer code can be transmitted over communication networks, including Internets and intranets.

It is understood that the invention can be embodied in computer code (e.g., as part of an IP (intellectual property) core, such as a microprocessor core, or a system-level design, such as a System on Chip (SOC)) and transformed to hardware as part of the production of integrated circuits. Also, the invention may be embodied as a combination of hardware and computer code.

Figure 6:
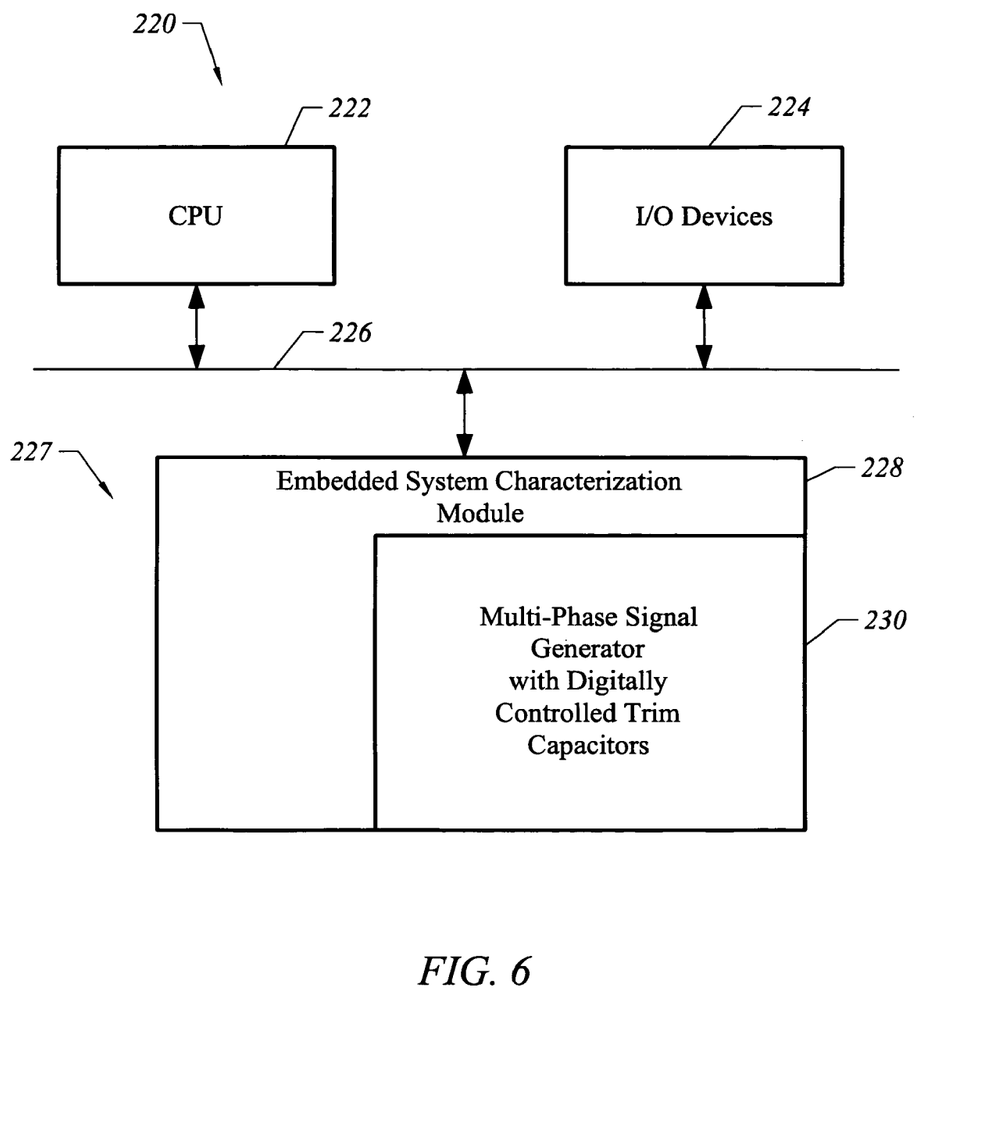
FIG. 6 illustrates the invention implemented as a computer readable medium processed by a computer.

FIG. 6 illustrates a computer-implemented embodiment of the invention. In particular, FIG. 6 illustrates a computer 220 with a central processing unit 222 and a set of input/output devices 224 connected via a bus 226. A memory 227 is also connected to the bus 226. The memory 226 stores an embedded system characterization module 228. This module defines in computer code an embedded system or other architectural system. A component of the architectural system is a multi-phase signal generator with digitally controlled trim capacitors 230 of the type described herein. Thus, module 230 describes in computer code the physical components and operative aspects of the device of FIGS. 1–5.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus for generating multi-phase signals, comprising:
    a single delay chain comprising a series of delay elements and associated taps configured to produce multi-phase signals, a slow boundary signal, and a fast boundary signal, said multi-phase signals corresponding to a plurality of output clock signals that are each phase delayed by a different delay with respect to an input clock signal;
    an array of trim capacitors connected to said single delay chain;
    a timing control window circuit to produce a control signal when a reference signal is outside a timing control window defined by said slow boundary signal and said fast boundary signal; and
    a digital circuit to produce a digital capacitive trim signal for application to said array of trim capacitors in response to said control signal, said digital capacitive trim signal altering the capacitive loading of said single delay chain to control a position of each control timing edge of said plurality of output clock signals with respect to said input clock signal;
    wherein said control signal operates to maintain said reference signal within said control window such that said reference signal transitions after said fast boundary signal and before said slow boundary signal.

2. The apparatus of claim 1 wherein said single delay chain includes serially connected inverters and individual tap lines between said serially connected inverters to carry said multi-phase signals.

3. The apparatus of claim 1 wherein said timing control window circuit includes a slow signal detector to produce said control signal when said reference signal transitions after said slow boundary signal.

4. The apparatus of claim 1 wherein said timing control window circuit includes a fast signal detector to produce said control signal when said reference signal transitions before said fast boundary signal.

5. The apparatus of claim 1 wherein said digital circuit comprises a shift register.

6. An apparatus for generating multi-phase signals, comprising:
    a single delay chain comprising a series of delay elements and associated taps configured to produce multi-phase signals, said multi-phase signals corresponding to a plurality of output clock signals that are each phase delayed by a different delay with respect to an input clock signal;
    an array of trim capacitors connected to said single delay chain;
    a first phase detector to produce a slow state control signal when a reference signal transitions after a slow boundary signal;
    a second phase detector to produce a fast state control signal when said reference signal transitions before a fast boundary signal; and
    a digital circuit responsive to said slow state control signal and said fast state control signal to produce a digital capacitive trim signal for application to said array of trim capacitors to control a position of each control timing edge of said plurality of output clock signals with respect to said input clock signal;
    wherein said control signals operate to maintain said reference signal within control window such that said reference signal transitions after said fast boundary signal and before said slow boundary signal.

7. The apparatus of claim 6 wherein said single delay chain includes serially connected inverters and individual tap lines between said serially connected inverters to carry said multi-phase signals.

8. The apparatus of claim 6 wherein said digital circuit comprises a shift register.

9. A method of generating multi-phase signals, comprising:
    applying a signal to a single delay chain having a series of delay elements and associated taps configured to produce multi-phase signals, said multi-phase signals corresponding to a plurality of output clock signals that are each phase delayed by a different delay with respect to an input clock signal;
    generating a digital control signal to increase capacitance in a trim capacitor array connected to said single delay chain when a reference signal transitions after a slow boundary signal; and
    producing a digital control signal to decrease capacitance in said trim capacitor array connected to said single delay chain when said reference signal transitions before a fast boundary signal;
    whereby a position of each control timing edge of said plurality of output clock signals with respect to said input clock signal is controlled to maintain said reference signal transition after said fast boundary signal and before said slow boundary signal.

10. A computer data signal embodied in a transmission medium, comprising:
    computer-readable program code to cause a computer to characterize:
        a single delay chain comprising a series of delay elements and associated taps configured to produce multi-phase signals, said multi-phase signals corresponding to a plurality of output clock signals that are each phase delayed by a different delay with respect to an input clock signal;

an array of trim capacitors attached to said single delay chain;

a timing control window circuit producing a control signal when a reference signal is outside a timing window; and a digital circuit producing a digital capacitive trim signal, responsive to said control signal, for application to said array of trim capacitors to control a position of each control timing edge of said plurality of output clock signals with respect to said input clock signal;

wherein said digital capacitive trim signal operates to maintain reference signal transitions after said fast boundary signal and before said slow boundary signal.

11. A computer readable medium to direct the operation of a computer, comprising:

computer-readable program code to cause a computer to characterize:

a single delay chain comprising a series of delay elements and associated taps configured to produce multi-phase signals, said multi-phase signals corresponding to a plurality of output clock signals that are each phase delayed by a different delay with respect to an input clock signal;

an array of trim capacitors attached to said single delay chain;

a timing control window circuit producing a control signal when a reference signal is outside a timing window; and a digital circuit producing a digital capacitive trim signal, responsive to said control signal, for application to said array of trim capacitors to control a position of each control timing edge of said plurality of output clock signals with respect to said input clock signal;

wherein said digital capacitive trim signal operates to maintain reference signal transitions after said fast boundary signal and before said slow boundary signal.

* * * * *